United States Patent [19]
Cowpland

[11] 3,824,345

[45] July 16, 1974

[54] AUDIO FREQUENCY AUTOMATIC GAIN CONTROL CIRCUIT

[75] Inventor: Michael C. J. Cowpland, Ottawa, Ontario, Canada

[73] Assignee: Microsystems International Limited, Montreal, Quebec, Canada

[22] Filed: May 7, 1973

[21] Appl. No.: 358,155

[30] Foreign Application Priority Data

May 2, 1973 Canada ............................... 170249

[52] U.S. Cl. ............... 179/1 VL, 333/17, 333/28 T, 325/405

[51] Int. Cl. ............................................ H04m 1/74

[58] Field of Search.. 179/84 VF, 1 D, 1 VL, 170.8; 333/17, 18, 28 T; 325/405, 408, 424

[56] References Cited

UNITED STATES PATENTS

| | | | |
|---|---|---|---|
| 3,162,801 | 12/1964 | Bogotch et al. | 325/408 |
| 3,566,276 | 2/1971 | Finkel | 325/409 |
| 3,579,114 | 5/1971 | Kozawa et al. | 325/405 |
| 3,671,886 | 6/1972 | Fudemoto et al. | 333/18 |

*Primary Examiner*—Kathleen H. Claffy
*Assistant Examiner*—Gerald L. Brigance
*Attorney, Agent, or Firm*—E. E. Pascal

[57] ABSTRACT

An integrated circuit design for an audio frequency automatic gain control circuit, for use in telephone tone receiver circuits. To ensure stability, along with rapid response and recovery times, a control voltage derived in part from the audio frequency signal carried by the automatic gain control circuit is used to control the attenuation of a balanced attenuator stage and to introduce a direct current bias voltage shift to the audio frequency signal in its passage through a subsequent unbalanced stage. This d.c. bias voltage shift occurs as a linear function of the voltage difference between the control and reference voltages. The use of a combination of balanced and unbalanced stages minimizes undesired control voltage feedthrough along the audio frequency signal path, which might be in either a regenerative or degenerative direction, while the unbalance introduced by the bias voltage shift circuitry, which is in the degenerative direction, swamps out any regenerative control voltage feedthrough.

23 Claims, 1 Drawing Figure

PATENTED JUL 16 1974 3,824,345
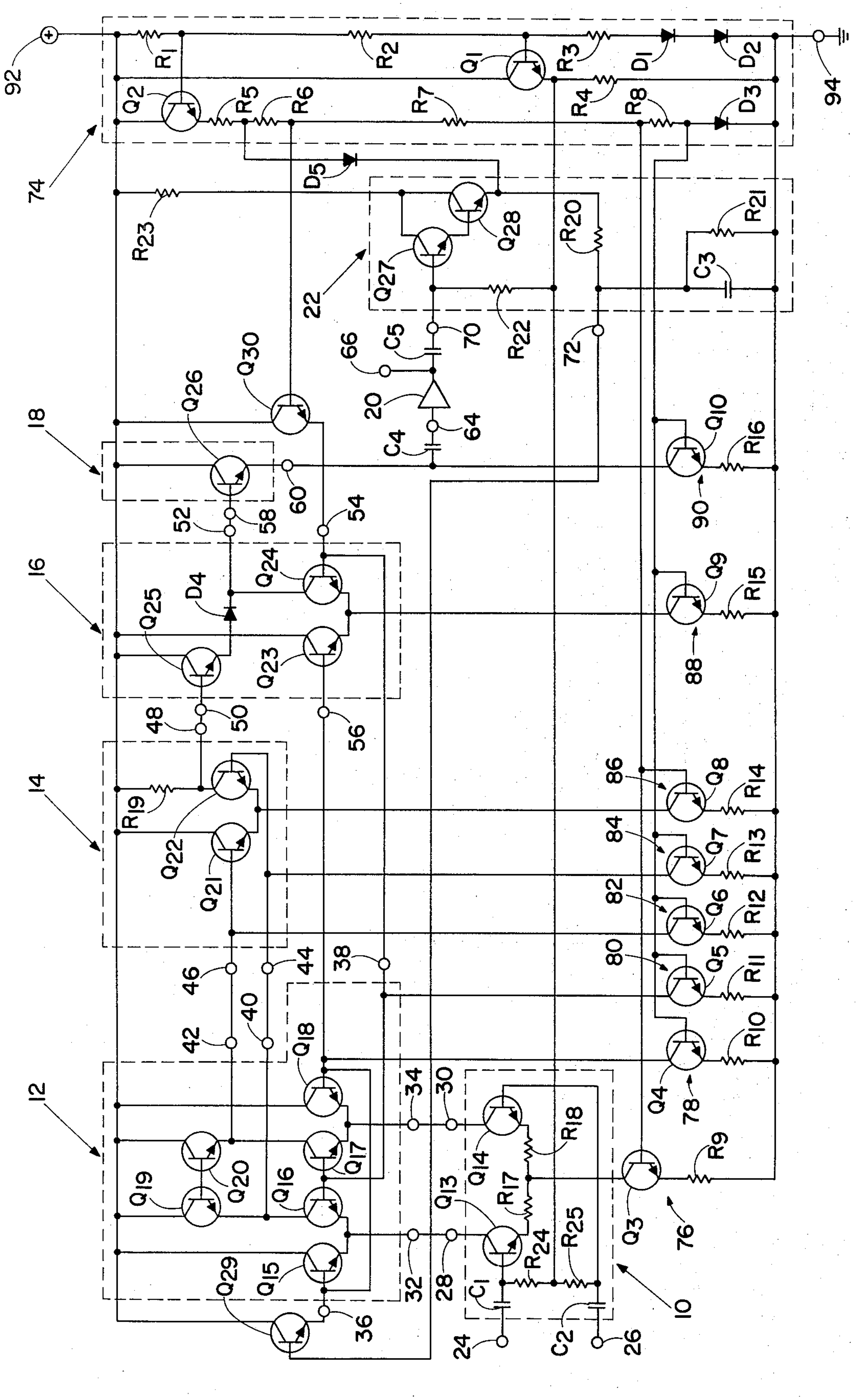

AUDIO FREQUENCY AUTOMATIC GAIN CONTROL CIRCUIT

This invention relates to automatic gain control circuits and more particularly to an audio frequency automatic gain control circuit, with rapid response and settling times for receiving telephone tone signals.

In the design of practical automatic gain control circuits for integrated circuit fabrication, difficulty is often experienced in preventing the control voltage from feeding through the signal path. This difficulty is due in part to direct coupled circuitry design, characteristic of integrated circuit structures, in which capacitors are avoided whenever it is practical to do so.

When the frequency range of the signal band of interest is relatively high with respect to the frequency range of the control voltage, as is typically the case in automatic gain controlled I.F. amplifiers (typically 455KHz I.F. frequency and 50ms control voltage time constant respectively), little difficulty is experienced in attenuating the control voltage so as to effectively remove said control voltage from the signal path. When however the frequency range of the control voltage is close to the signal band of interest, as in the case of audio frequency gain control circuits used in telephone tone receiver circuits (typically 3ms control voltage time constant and 300Hz lower signal frequency respectively), the separation of the control and signal voltages becomes difficult to achieve without affecting the stability of the system.

In order to ensure stability in a system intended for audio frequency signals, two approaches are generally taken. In one approach an unbalanced system is used in which the phase of the control voltage feedthrough is in the degenerative direction whereas in an alternate approach the design of the system is made to be as closely balanced as practical to minimize control voltage feedthrough.

In the unbalanced system approach the large amount of control voltage feedthrough usually required minimizes the tendency toward instability but increases the settling time of the system. Balanced systems however have the advantage of rapid response time and tight output signal level control, yet, as it is practically difficult to manufacture a closely balanced system, systems though designed as balanced systems are potentially unstable due to the likelihood of regenerative feedthrough.

It has been found that an audio frequency automatic gain control system can be built with certain desirable features of the balanced and unbalanced systems along a design in which the signal voltage is first passed through a balanced variable gain element and thereafter through an unbalanced circuit where a d.c. voltage shift is added to the signal voltage. In this combined system the control voltage required to ensure stability is much smaller than the amount required for a typical unbalanced system and as a result rapid response and settling times are realizable.

Thus in accordance with the present invention the audio frequency automatic gain control circuit, or automatic gain control circuit comprises a balanced attenuator stage having a reference voltage input terminal, a control voltage input terminal, first and second balanced input attenuator terminals for connection to an audio frequency signal source, and first and second balanced output attenuator terminals. The attenuation introduced by the balanced attenuator stage, to a audio frequency signal passing therethrough, being a function of the voltage difference between the control voltage appearing at the control voltage input terminal and a reference voltage appearing at the reference voltage input terminal. A differential amplifier stage, having first and second balanced input terminals and a single ended output terminal, forms part of the audio frequency automatic gain control circuit. The first and second balanced input terminals of the differential amplifier being respectively connected to the first and second balanced output terminals of the balanced attenuator stage. A bias shifting stage having a reference voltage input terminal, a control voltage input terminal, as well as a signal input terminal and a signal output terminal is connected via its signal input terminal to the single ended output terminal of the differential amplifier stage. A direct current (d.c.) level shift, which is substantially a linear function of the voltage difference between the reference voltage appearing at the reference voltage input terminal and the control voltage appearing at the control voltage input terminal, is added to audio frequency signals appearing at the signal input terminal of the bias shifting stage. A peak detector circuit, having an input detector terminal and an output detector terminal, of which the input detector terminal is connected via a capacitance means to the signal output terminal of the bias shifting stage, is connected, via its output detector terminal, to the control voltage input terminal of the balanced attenuator stage as well as to the control voltage input terminal of the bias shifting stage. In response to an amplitude change in the audio frequency voltage appearing at the first and second balanced input terminals of the balanced attenuator stage, the control voltage appearing at the output detector terminal of the peak detector circuit correspondingly changes thereby changing the attenuation introduced by the balanced attenuator stage, while changing the d.c. voltage level appearing at the signal input terminal of the bias shifting stage, so as to maintain the peak-to-peak audio signal voltage appearing at the input detector terminal of the peak detector circuit at a substantially constant value.

An example embodiment of the invention will now be described with reference to the accompanying drawing. This drawing is a schematic representation of an audio frequency automatic gain control circuit in accordance with the present invention.

Referring to the single FIGURE the audio frequency automatic gain control circuit comprises a first differential amplifier stage 10, a balanced attenuator stage 12, a second differential amplifier stage 14, a bias shifting stage 16, a direct coupled single ended amplifier stage 18, an inverting amplifier 20, and a peak detector circuit 22.

The first differential amplifier stage 10 has first 24 and a second 26 input terminals for connection to an audio frequency source, which is not shown, and first 28 and second 30 balanced output terminals for connection to the first 32 and second 34 balanced input attenuator terminals respectively of the balanced attenuator stage 12.

The balanced attenuator stage 12 has, in addition to the first 32 and second 34 balanced input attenuator terminals, a control voltage input terminal 36, a reference voltage input terminal 38, as well as first 40 and second 42 balanced output attenuator terminals. The second differential amplifier stage 14 is provided with first 44 and second 46 balanced input terminals, which are respectively connected to the first 40 and second 42 balanced output terminals of the balanced attenuator stage 12, and a single ended output terminal 48 which is connected to a signal input terminal 50 of the bias shifting stage 16. The bias shifting stage 16 is also provided with a signal output terminal 52, a reference voltage input terminal 54, and a control voltage input terminal 56. The control voltage input terminal 56 of the bias shifting stage 16 is connected to the control voltage input terminal 36 of the balanced attenuator stage 12, and the reference voltage input terminal 54 of the bias shifting stage 16 is connected to the reference voltage input terminal 38 of the balanced attenuator stage 12.

The direct coupled single ended amplifier stage 18 is provided with an input terminal 58 which is connected to the signal output terminal 52 of the bias shifting stage 16, and an output terminal 60 which is connected via a first capacitor $C_4$ to the input terminal 64 of the inverting amplifier 20. The output terminal 66 of the inverting amplifier 20, is connected via a second capacitor $C_5$ to the input detector terminal 70 of the peak detector circuit 22. The control voltage which appears at the output detector terminal 72 of the peak detector circuit 22 is connected via transistor $Q_{19}$ to the control voltage input terminal 36 of the balanced attenuator 12 and the control voltage input terminal 56 of the bias shifting stage 16.

In addition to the main functional blocks which have been briefly described the audio frequency automatic gain control system, shown in the sole drawing, also includes a bias voltage supply 74 and a number of constant current supplies 76, 78, 80, 82, 84, 86, 88, 90, which set the bias points for the various functional blocks 10, 12, 14, 16, 18, 20, 22. It should be noted that the circuit shown in the sole drawing is intended for integrated circuit fabrication and such being the case, transistors are used whenever possible and resistors values are kept as low as is practical.

Turning first to the bias voltage supply 74, resistors, $R_1$, $R_2$ $R_3$ and diodes $D_1$ and $D_2$ are serially arranged to form a voltage divider across the supply voltage terminals 92, 94. The collector electrode of a first regulator transistor $Q_1$ is directly connected to the positive supply voltage terminal 92, the emitter electrode of said regulator transistor $Q_1$ is connected via a resistor $R_4$ to the negative supply voltage or ground terminal 94 and the base electrode of said regulator transistor $Q_1$ is connected to the junction of resistors $R_2$ and $R_3$. A regulated voltage is available at the emitter electrode of said transistor $Q_1$ which is supplied to various circuitry of the automatic gain control circuit as will be described later. The bias voltage supply 74 also includes a second regulator transistor $Q_2$ and serially arranged resistors $R_5$, $R_6$, $R_7$, $R_8$ and diode $D_3$. The collector electrode of the second regulator transistor $Q_2$ is connected to the positive supply voltage terminal 92, the emitter electrode of said second regulator transistor $Q_2$ is connected to resistor $R_5$ and thereafter through resistors $R_6$, $R_7$ $R_8$ and diode $D_3$ to the negative supply voltage or ground terminal 94 while the base electrode of transistor $Q_2$ is connected to the junction of resistors $R_1$ and $R_2$.

Operating voltages for the automatic gain control circuitry are obtained at the junction of resistors $R_5$ and $R_6$, at the junction of resistors $R_6$ and $R_7$, the junction of resistors $R_7$ and $R_8$ and at the junction of resistor $R_8$ and diode $D_3$. In view of the well known straight forward design of the bias voltage supply 74 no further explanation is believed necessary.

The various constant current supplies, 76, 78, 80, 82, 84, 86, 88 and 90 provided for biasing the automatic gain control circuitry respectively utilize transistors $Q_3$, $Q_4$, $Q_5$, $Q_6$, $Q_7$, $Q_8$, $Q_9$, and $Q_{10}$ and resistors $R_9$, $R_{10}$, $R_{11}$, $R_{12}$, $R_{13}$, $R_{14}$, $R_{15}$ and $R_{16}$. The base electrodes of transistors $Q_3$ and $Q_8$ are connected to the junction of resistors $R_7$ and $R_8$ while the base electrodes of transistors $Q_4$, $Q_5$, $Q_6$, $Q_7$, $Q_9$ and $Q_{10}$ are connected to the junction of resistor $R_8$ and the anode of diode $D_3$. Resistors $R_9$, $R_{10}$, $R_{11}$, $R_{12}$, $R_{13}$, $R_{14}$, $R_{15}$ and $R_{16}$ respectively connect the emitters of transistors $Q_3$, $Q_4$, $Q_5$, $Q_6$, $Q_7$, $Q_8$, $Q_9$ and $Q_{10}$ to the negative voltage supply or ground terminal 94, while the collector electrodes of each of said transistors is connected to supply operating current to the various functional blocks as will be described later.

The various functional blocks 10, 12, 14, 16, 18, 20, and 22 will now be described with reference to the sole drawing.

The first differential amplifier 10 comprises an emitter-coupled pair of transistors $Q_{13}$, $Q_{14}$. The collector electrode of one transistor $Q_{13}$ is connected to the first balanced output terminal 28 of the first differential amplifier stage 10, while the collector electrode of the other transistor $Q_{14}$ is connected to the second balanced output terminal 30 of the first differential amplifier stage. The base electrodes of transistor $Q_3$ and transistor $Q_4$ are respectively connected via capacitor $C_1$ and capacitor $C_2$ to the first 24 and second 26 input terminals of the first differential amplifier stages. Additionally the base of transistors $Q_{13}$ and $Q_{14}$ are respectively connected via resistors $R_{24}$ and $R_{25}$ to the emitter electrode of transistor $Q_1$ of the bias voltage supply 74. The emitter electrodes of transistor $Q_{13}$ and $Q_{14}$ are respectively connected through resistors $R_{17}$ and $R_{18}$ to the collector electrode of transistor $Q_3$ of constant current source 76.

The balanced attenuator stage 12 comprises a first emitter-coupled transistor pair $Q_{15}$, $Q_{16}$ and a second emitter-coupled transistor pair $Q_{17}$, $Q_{18}$. The emitter electrodes of the first emitter-coupled transistor pair $Q_{15}$, $Q_{16}$ and the emitter electrodes of the second emitter-coupled transistor pair $Q_{17}$, $Q_{18}$ being respectively connected to the first 32 and second 34 balanced input attenuator terminals. The first transistor $Q_{16}$ of the first emitter-coupled transistor pair $Q_{15}$, $Q_{16}$ is connected to the first balanced output terminal 40 of the balanced attenuator stage 12 and via the collector emitter junction of a transistor $Q_{19}$ to the positive supply voltage terminal 92. Similarly the first transistor $Q_{17}$ of the second emitter-coupled transistor pair $Q_{17}$, $Q_{18}$ is connected to the second balanced output terminal 42 of the balanced attenuator stage 12 and via the collector emitter junction of a transistor $Q_{20}$ to the positive supply voltage terminal 92. The base electrodes of transistor $Q_{19}$ and $Q_{20}$ being connected together. The collector electrodes of the second transistors $Q_{15}$ and $Q_{18}$ of the first and second emitter-coupled transistor pairs, respectively, being connected to the positive supply voltage terminal 92, while the base electrodes of said second transistor $Q_{15}$, $Q_{18}$ being connected together and further connected to the control voltage input terminal 36 of the balanced attenuator stage 12 and the collector of transistor $Q_4$ of constant current source 78. The base electrodes of the first transistor $Q_{16}$, $Q_{17}$ of the first and second emitter-coupled transistor pairs being connected together and further connected to the reference voltage input terminal 38 of the balanced attenuator stage 12 and to the collector electrode of transistor $Q_5$ of constant current source 80.

The second differential amplifier stage 14 comprises an emitter-coupled transistor pair $Q_{21}$ $Q_{22}$. The base electrode of one transistor $Q_{22}$ is connected to the first balanced input terminal 44 and to the collector of transistor $Q_7$ of constant current source 84 while the base electrode of the other transistor $Q_{21}$ is connected to the second balanced input terminal 46 of the second differential amplifier stage, and to the collector of transistor $Q_6$ of constant current source 82. The emitter electrodes of transistors $Q_{21}$ and $Q_{22}$ are connected together and further connected to the collector of transistor $Q_8$ of constant current source 86. The collector of said one transistor $Q_{22}$ is connected to the single ended output terminal 48 and via resistor $R_{19}$ to the positive supply voltage terminal 92, while the collector of said other transistor $Q_{21}$ is directly connected to the positive supply voltage terminal 92.

The bias shifting stage 16 comprises an emitter-coupled transistor pair $Q_{23}$, $Q_{24}$, a diode $D_4$ and a transistor $Q_{25}$ connected as an emitter follower. The base electrode of transistor $Q_{25}$ is connected to the signal input terminal 50 of the bias shifting stage 16, the collector electrode of transistor $Q_{25}$ is connected to the positive supply voltage terminal 92 and the emitter electrode of said transistor $Q_{25}$ is connected via diode $D_4$ to the signal output terminal 52 of the bias shifting stage 16. The base electrode of one transistor $Q_{23}$ is connected to the control voltage input terminal 56 and the base electrode of the other transistor $Q_{24}$ is connected to the reference voltage input terminal 54 of the bias shifting stage 16. The collector electrode of said one transistor $Q_{23}$ is connected to the positive supply voltage terminal 92 and the collector electrode of said other transistor $Q_{24}$ is connected to the cathode of diode $D_4$ or equivalently to the signal output terminal 52. The emitters of transistors $Q_{23}$ and $Q_{24}$ are connected together and further connected to the collector of transistor $Q_9$ of constant current source 88. Direct coupled single ended amplifier stage 18 consists of a transistor $Q_{26}$ arranged as an emitter follower. The base electrode of transistor $Q_{26}$ is connected to the input terminal 58, the collector electrode of said transistor $Q_{26}$ is directly connected to the positive supply voltage terminal 92, while the emitter electrode of transistor $Q_{26}$ is connected to the output terminal 60 of the single ended amplifier stage 18 and to the collector electrode of transistor $Q_{10}$ of constant current supply 90.

The peak detector circuit comprises darlington connected transistors $Q_{27}$ and $Q_{28}$, a charge resistor $R_{20}$, capacitor $C_3$, discharge resistor $R_{21}$ and resistors $R_{22}$ and $R_{23}$. The base electrode of transistor $Q_{27}$ is connected to the input detector terminal 70 and to resistor $R_{22}$, resistor $R_{22}$ in turn is connected to the emitter electrode of transistor $Q_1$ of bias voltage supply 74. The collectors of the darlington connected transistors $Q_{27}$, $Q_{28}$ are connected via resistor $R_{23}$ to the positive supply voltage terminal 92 while the emitter electrode of transistor $Q_{28}$ is connected via charging resistor $R_{20}$ to the junction of capacitor $C_3$, discharge resistor $R_{21}$ and output detector terminal 72. Capacitor $C_3$ and discharge resistor $R_{21}$ are connected in parallel and bridge the output detector terminal 72 to the negative supply voltage terminal 94. The junction of charge resistor $R_{20}$ and the emitter electrode of transistor $Q_{28}$ is connected to the cathode of a diode $D_5$ while, the anode of diode $D_5$ is connected to the junction of resistors $R_5$ and $R_6$.

In addition to the aforementioned circuitry transistor $Q_{29}$, which is connected as an emitter follower, links the output detector terminal 72 of the peak detector circuit 22 to the control voltage input terminal 36 of the balanced attenuator stage 12 as well as to the control voltage input terminal 56 of the bias shifting stage 16 in order to minimize the control current drawn from the peak detector circuit 22. Transistor $Q_{30}$, which is also connected as an emitter follower, links a reference voltage appearing at the junction of resistors $R_6$ and $R_7$ of the bias voltage supply 74 to the reference voltage input terminals 54 and 38 of the bias shifting stage 16 and the balanced attenuator stage 12 respectively. Transistor $Q_{30}$ supplies the required reference current from the positive supply voltage terminal 92 with minimum loading to the voltage divider associated with transistor $Q_2$.

In normal operation of the audio frequency automatic gain control circuit an audio frequency signal source (not shown) is connected to the first 24 and second 26 input terminals of the first differential amplifier 10. This audio frequency signal from the audio frequency signal source may be either a balanced signal or an unbalanced signal as the first differential amplifier stage 10 will serve to reject any common mode voltages appearing with said audio frequency signal. The conduction of transistors $Q_{13}$ and $Q_{14}$ will vary in accordance with the applied audio frequency signal and as a result corresponding currents will flow in the collector circuits of transistors $Q_{13}$ and $Q_{14}$ of the first differential amplifier stage 10 and the emitter circuits of the first and second emitter-coupled transistor pairs of the balanced attenuator stage 12. The portions of the collector current of transistor $Q_{13}$, which will pass through transistors $Q_{15}$ and $Q_{16}$, will depend on the relative conduction of transistors $Q_{15}$ and $Q_{16}$ as determined by the control voltage appearing at the base electrode of transistor $Q_{15}$, and the reference voltage appearing at the base electrode of transistor $Q_{16}$. Similarly the portion of the collector current of transistor $Q_{14}$, which will pass through transistors $Q_{17}$ and $Q_{18}$ will depend on the relative conduction of transistors $Q_{17}$ and $Q_{18}$ as determined by the control voltage appearing at the base electrode of transistor $Q_{18}$ and reference voltage appearing at the base electrode of transistor $Q_{17}$.

If the control voltage is increased relative to the reference voltage transistors $Q_{15}$ and $Q_{18}$ conduct more heavily than transistor $Q_{16}$ and $Q_{17}$ and as a result the audio frequency signal appearing at the first 40 and second 42 balanced output terminals of the balanced attenuator stage 12 is attenuated. Conversely when transistors $Q_{16}$ and $Q_{17}$ conduct more heavily than transistors $Q_{15}$ and $Q_{18}$, the attenuation introduced by the balanced attenuator stage 12 is reduced and audio frequency signals appear at the first 40 and second 42 balanced output attenuator terminals of the balanced attenuator stage 12 with greater magnitude.

The attenuation introduced by the balanced attenuator stage is substantially an exponential function of the voltage difference between the voltages appearing at the control voltage and reference voltage input terminal of the balanced attenuator stage 12. The audio frequency signal voltage appearing at the first 40 and second 42 balanced attenuator output terminals is fed to the second differential amplifier stage 14 where a single ended, or unbalanced, audio frequency signal voltage is obtained across resistor $R_{19}$ which is in the collector circuit of transistor $Q_{22}$.

In the bias shifting stage 16 transistors $Q_{23}$ and $Q_{24}$ control the flow of direct current passing through transistor $Q_{25}$ and diode $D_4$. If the reference voltage applied to the base of transistor $Q_{24}$ is larger than the control voltage applied to the base of transistor $Q_{23}$, the conduction of transistor $Q_{24}$ will increase and as a result the flow of direct current through diode $D_4$ and transistor $Q_{25}$ will also increase. Although the flow of collector current through transistor $Q_{24}$ is substantially an exponential function of the voltage difference between the control and reference voltages appearing at the bases of transistors $Q_{23}$ and $Q_{24}$ the current voltage characteristic of diode $D_4$ and the emitter diode characteristic of transistor $Q_{25}$ are such that the voltage appearing between the cathode of diode $D_4$ and the positive supply voltage terminal 92 is substantially a linear function of the voltage difference between the control and reference voltages appearing at the bases of transistors $Q_{23}$ and $Q_{24}$ respectively. The bias shifting stage 16 therefore introduces a controllable d.c. level shift between the d.c. voltage appearing at the signal input terminal 50 and the signal output terminal 52 of the bias shifting stage 16. Transistor $Q_{25}$ serves as an emitter follower to minimize loading of resistor $R_{19}$ while contributing its emitter diode to the collector circuit of transistor $Q_{24}$ as previously described.

Another version of the bias shifting stage 16 which is not shown can be formed by removing transistor $Q_{25}$ and diode $D_4$ and providing a direct connection from the signal input terminal 50 to the signal output terminal 52. Additionally a resistor of suitable magnitude must be inserted in the emitter circuit of transistors $Q_{23}$ and in the emitter circuit of transistor $Q_{24}$. This modified circuit will operate in a manner similar to the operation of the bias shifting stage 16 previously described as the presence of resistors in the emitter circuit of transistors $Q_{23}$ and $Q_{24}$ will linearize the flow of current through resistor $R_{19}$ with respect to differences in voltage between the control voltage applied to the control voltage input terminal 56, and the reference voltage applied to the reference voltage input terminal 34 of the bias shifting stage.

The audio frequency signal voltage appearing at the signal input terminal 50 of the bias shifting stage 16 appears at the signal output terminal 52 of the bias shifting stage 16 with substantially no change in its peak-to-peak magnitude, however, the d.c. voltage level of said audio frequency voltage is shifted, while passing through the bias shifting stage 16, as previously described. Transistor $Q_{26}$, which is also connected as an emitter follower, serves to transfer the audio signal voltage and its d.c. bias level, which appear at the signal output terminal 52 of the bias shifting stage 16, to the inverting amplifier 20.

If, we assume that, the audio frequency signal appearing at the input terminals 24, 26 of the first differential amplifier stage increases in peak-to-peak amplitude, the corresponding audio frequency signal which passes through the balanced attenuator stage 12, the second differential amplifier stage 14, the bias shifting stage 16, the direct coupled single ended amplifier stage 18 and the inverting amplifier 20 increases accordingly. If the peak-to-peak audio frequency signal voltage appearing at the output terminal 66 of the inverting amplifier 20, when added to the d.c. bias voltage appearing at the input detector terminal 70, exceeds the emitter bias voltage of transistor $Q_{27}$ of the darlington transistor pair $Q_{27}$, $Q_{28}$, said transistors $Q_{27}$ and $Q_{28}$ conduct so as to increase the charge in capacitor $C_3$. Concurrent with the increase in charge in capacitor $C_3$, the control voltage applied to the balanced attenuator stage 12 and the bias shifting stage 16 increases so as to increase the attenuation introduced by the balanced attenuator 12 and to increase the conduction of transistor $Q_{23}$ of the bias shifting stage 16. The increased conduction of transistor $Q_{23}$ relative to the conduction of transistor $Q_{24}$, reduces the direct current conduction through diode $D_4$ and thereby raises (more positive) the bias voltage applied to the base of transistor $Q_{26}$. Consequently, the d.c. voltage level at the emitter of transistor $Q_{26}$, which is connected to constant current source 90 increases. This d.c. voltage level increase, which is amplified and inverted by inverting amplifier 20, results in a temporary downward or negative shift in the d.c. level of the audio frequency signal applied to the base of transistors $Q_{27}$ and $Q_{28}$. This temporary downward d.c. level shift serves to momentarily decrease the bias voltage applied to the base of transistor $Q_{27}$, thus avoiding overcharging of $C_3$ and stabilizing the system at a new overall lower gain value.

Conversely if the audio frequency signal appearing at the input terminals 24, 26 of the first differential amplifier stage decreases in peak-to-peak amplitude the control voltage decreases as $R_{21}$ discharges capacitor $C_3$ thereby decreasing the attenuation introduced by the balanced attenuator stage 12 and increasing the conduction of transistor $Q_{24}$ of the bias shifting stage 16. With the increased conduction of $Q_{24}$ the d.c. voltage level of the audio frequency signal voltage is shifted downward (less positively) by the bias shifting stage 16. The heavier conduction of transistor $Q_{24}$ relative to transistor $Q_{23}$ implies that the reference voltage appearing at the base of transistor $Q_{24}$ is now more positive than the control voltage appearing at the base of transistor $Q_{23}$. As a result of this downward shift in bias voltage by the bias shifting stage 16 the audio frequency signal voltage appearing at the input terminal 64 of the inverting amplifier 20 will experience a temporary negative or downward level shift. Note capacitors $C_4$ and $C_5$ permit only a momentary transfer of the d.c. level shift through the inverting amplifier 20. Inverting amplifier 20 amplifies the incoming signal voltage and d.c. level shift and applies a corresponding but inverted d.c. level shift (positive in this case) to the signal appearing at the input detector terminal 70 of the peak detector circuit 22. This d.c. level shift is in the degenerative direction thus enhancing the stability of the system.

As the base of transistor $Q_{27}$ is biased via resistor $R_{22}$ at a lesser positive voltage than the emitter of transistor $Q_{28}$, transistors $Q_{27}$ and $Q_{28}$ will conduct only when the voltage appearing at the input detector terminal 70 is sufficiently positive. Since, in accordance with our assumption, the voltage appearing at the output terminal 66 of the inverting amplifier 20 is undergoing a positive d.c. shift, transistors $Q_{27}$ and $Q_{28}$ conduct so as to increase the charge in capacitor $C_3$ and therewith the control voltage appearing at the output detector terminal 72 of the peak detector circuit 22. As the control voltage increases, the attenuation introduced by the balanced attenuator stage 12 also increases. Consequently the attenuation applied to an audio frequency signal voltage, appearing at the input terminals 24, 26 of the first differential amplifier stage 10, with a reduced peak-to-peak amplitude, decreases until a desired signal output level appears at the output terminal 66 of the inverting amplifier 20. This decrease in attenuation is balanced against an increased attenuation resulting from the positive d.c. shift appearing at the output terminal 66 of the inverting amplifier 20 which stabilizes the system at the new higher overall gain value.

It can be seen that rapid regulator response is achieved by introducing to the audio frequency signal, a d.c. bias shift which is substantially a linear function of the voltage difference between the control and reference voltages. It should be noted that first and second capacitors $C_4$ and $C_5$ allow only a pulse representation of the bias voltage shift introduced by the bias shifting stage 16 to pass through the inverting amplifier 20.

Diode $D_5$ serves to partially precharge capacitor $C_3$ so as to avoid a long delay in charging $C_3$ if the audio frequency automatic gain control circuit is suddenly hit with a tone burst after a period of being idle. The attack time of the system is partially determined by charge resistor $R_{20}$, charge capacitor $C_3$ and the time required to alter the charge in the first and second capacitors $C_4$, $C_5$ by the d.c. voltage shift occurring due to the control voltage feedthrough. The recovery time of the system is controlled by resistor $R_{21}$.

Depending on the design requirements the audio frequency automatic gain control system described can be constructed without the first differential amplifier stage 10 if the applied audio frequency signal is balanced and has sufficient gain; and/or without the direct coupled single ended amplifier stage 18 if the system gain is sufficient and loading of the signal output terminal 52 of the bias shifting stage can be tolerated; and/or without the inverting amplifier 20 if the gain is sufficient and inversion can be introduced elsewhere in the system circuitry.

In a manufactured version of the circuit illustrated in the sole FIGURE the voltage on the base of transistor $Q_{26}$ varies at approximately 120mv per decade change in current through transistor $Q_{24}$ due to the change in voltage drop this current produces across transistor $Q_{25}$ and diode $D_4$. This logarithmic variation in bias with current through diode $D_4$, (note the current through diode $D_4$ is an exponential function of the voltage difference between the control and reference voltages) results in smoother bias shifting over the entire gain range of the automatic gain control circuit than would be realized with linear variation in bias with current through diode $D_4$. Because the variation in current through transistor $Q_{24}$, which is exponential as aforesaid, passes through non linear elements, (transistor $Q_{25}$ and diode $D_4$) the d.c. voltage variation measured between the cathode of diode $D_4$ and the positive supply voltage terminal 92 is substantially a linear function of a voltage change between the control and reference voltages. The dynamic range of the automatic gain control circuit described is controlled by the gain of the inverting amplifier 20. The gain of a typical automatic gain control circuit, which is set at a maximum of unity, can be reduced by approximately 46 db when appropriate control voltage levels are applied to the control voltage input terminal 36 of the balanced attenuator stage 12. In practice a total of 140 mv change in control voltage is required for a dynamic range of 40 db. As this 140 mv change in audio signal voltage, which appears at the output terminal 66 of the inverting amplifier 20 for a 40 db input change, is very small, tight automatic gain control action is indicated.

Thus it can be seen that random variations in control voltage feedthrough, which will be small in view of the balanced stages, are swamped out or counteracted by a larger degenerative feedthrough introduced by the bias shifting stage 16 of the automatic gain control system described.

What is claimed is:

1. An audio frequency automatic gain control circuit comprising:

a. a balanced attenuator stage having a reference voltage input terminal and a control voltage input terminal, said attenuator stage further having first and second balanced input attenuator terminals for connection to an audio frequency signal source, and first and second balanced output attenuator terminals, the attenuation introduced by said balanced attenuator stage being a function of the voltage difference between a control voltage appearing at the control voltage input terminal and a reference voltage appearing at the reference voltage input terminal;

b. a differential amplifier stage having first and second balanced input terminals, and a single ended output terminal, the first and second balanced input terminals being respectively connected to the first and second balanced output attenuator terminals of the balanced attenuator stage;

c. a bias shifting stage having a reference voltage input terminal and a control voltage input terminal as well as a signal input terminal and a signal output terminal, the signal input terminal being connected to the single ended output terminal of the differential amplifier stage, said bias shifting stage introducing a d.c. level shift to audio frequency signals appearing at the signal input terminal of the bias shifting stage, said level shift being substantially a linear function of the voltage difference between the reference voltage appearing at the reference voltage input terminal and the control voltage appearing at the control voltage input terminal of the bias shifting stage;

d. a peak detector circuit having an input detector terminal and an output detector terminal, the input detector terminal being connected via a capacitance means to the signal output terminal of the bias shifting stage and the output detector terminal being connected to the control voltage input terminal of the balanced attenuator stage as well as the control voltage input terminal of the bias shifting stage;

whereby in response to an amplitude change in the audio frequency voltage appearing at the first and second balanced input terminals of the balanced attenuator stage the control voltage appearing at the output detector terminal of the peak detector circuit correspondingly changes, thereby changing the attenuation introduced by the balanced attenuator stage, while changing the d.c. voltage level appearing at the signal output terminal of the bias shifting stage, so as to maintain the peak-to-peak audio signal voltage appearing at the input detector terminal of the peak detector circuit at a substantially constant value.

2. The invention as defined in claim 1 wherein the peak detector circuit comprises a rectifying means in cascade with a low-pass filter, the input detector terminal of the peak detector circuit being connected to the rectifying means and output detector terminal of the peak detector circuit being connected to the low-pass filter.

3. The invention as defined in claim 1 wherein the bias shifting stage comprises an emitter-coupled transistor pair, the base electrode of one transistor of said emitter-coupled transistor pair being connected to the control voltage input terminal of said bias shifting stage, the base electrode of the other transistor of said emitter-coupled transistor pair being connected to the reference voltage input terminal of said bias shifting stage, the collector electrode of said other transistor being connected to the signal output terminal of said shifting stage and, via diode means, to the signal input terminal of said shifting stage.

4. The invention as defined in claim 1 wherein the peak detector circuit comprises a rectifying means in cascade with a low-pass filter, the input detector terminal of the peak detector circuit being connected to the rectifying means and output detector terminal of the peak detector circuit being connected to the low-pass filter, and wherein the bias shifting stage comprises an emitter-coupled transistor pair, the base electrode of one transistor of said emitter-coupled transistor pair being connected to the control voltage input terminal of said bias shifting stage, the base electrode of the other transistor of said emitter-coupled transistor pair being connected to the reference voltage input terminal of said bias shifting stage, the collector electrode of said other transistor being connected to the signal output terminal of said shifting stage and, via diode means, to the signal input terminal of said shifting stage.

5. The invention as defined in claim 4 wherein the balanced attenuator stage comprises a first emitter-coupled transistor pair and a second emitter-coupled transistor pair, the emitter electrodes of the first emitter-coupled transistor pair being connected to the first balanced input attenuator terminal and the emitter electrodes of the second emitter-coupled transistor pair being connected to the second balanced input attenuator terminal, the collector electrode of a first transistor of the first emitter-coupled transistor pair being connected to the first balanced output attenuator terminal and the collector electrode of a first transistor of the second emitter-coupled transistor pair being connected to the second balanced output attenuator terminal, the base electrode of the first transistor of the first emitter-coupled transistor pair being connected to the base electrode of the first transistor of the second emitter-coupled transistor pair as well as to the reference voltage input terminal of the balanced attenuator stage, while the base electrode of the second transistor of the first emitter-coupled transistor pair is connected to the base electrode of the second transistor of the second emitter-coupled transistor pair as well as to the control voltage input terminal of the balanced attenuator stage.

6. An audio frequency automatic gain control circuit comprising:

a. a balanced attenuator stage having a reference voltage input terminal and a control voltage input terminal, said attenuator stage further having first and second balanced input attenuator terminals for connection to an audio frequency signal source, and first and second balanced output attenuator terminals, the attenuation introduced by said balanced attenuator stage being a function of the voltage difference between a control voltage appearing at the control voltage input terminal and a reference voltage appearing at the reference voltage input terminal;

b. a differential amplifier stage having first and second balanced input terminals, and a single ended output terminal, the first and second balanced input terminals being respectively connected to the first and second balanced output attenuator terminals of the balanced attenuator stage;

c. a bias shifting stage having a reference voltage input terminal and a control voltage input terminal as well as a signal input terminal and a signal output terminal, the signal input terminal being connected to the single ended output terminal of the differential amplifier stage, said bias shifting stage introducing a d.c. level shift to audio frequency signals appearing at the signal input terminal of the bias shifting stage, said level shift being substantially a linear function of the voltage difference between the reference voltage appearing at the reference voltage input terminal and the control voltage appearing at the control voltage input terminal of the bias shifting stage;

d. an inverting amplifier having an input terminal and an output terminal the input terminal of said amplifier being connected via a capacitance means to the output terminal of the bias shifting stage;

e. a peak detector circuit having an input detector terminal and an output detector terminal, the input detector terminal being connected to the output terminal of the inverting amplifier and the output detector terminal being connected to the control voltage input terminal of the balanced attenuator stage as well as the control voltage input terminal of the bias shifting stage;

whereby in response to an amplitude change in the audio frequency voltage appearing at the first and second balanced input terminals of the balanced attenuator stage the control voltage appearing at the output detector terminal of the peak detector circuit correspondingly changes, thereby changing the attenuation introduced by the balanced attenuator stage, while changing the d.c. voltage level appearing at the signal output terminal of the bias shifting stage, so as to maintain the peak-to-peak audio signal voltage appearing at the output terminal of the inverting amplifier at a substantially constant value.

7. The invention as defined in claim 6 wherein the peak detector circuit comprises a rectifying means in cascade with a low-pass filter, the input detector terminal of the peak detector circuit being connected to the rectifying means and output detector terminal of the peak detector circuit being connected to the low-pass filter.

8. The invention as defined in claim 6 wherein the balanced attenuator stage comprises a first emitter-coupled transistor pair and a second emitter-coupled transistor pair, the emitter electrodes of the first emitter-coupled transistor pair being connected to the first balanced input attenuator terminal and the emitter electrodes of the second emitter-coupled transistor pair being connected to the second balanced input attenuator terminal, the collector electrode of a first transistor of the first emitter-coupled transistor pair being connected to the first balanced output attenuator terminal and the collector electrode of a first transistor of the second emitter-coupled transistor pair being connected to the second balanced output attenuator terminal, the base electrode of the first transistor of the first emitter-coupled transistor pair being connected to the base electrode of the first transistor of the second emitter-coupled transistor pair as well as to the reference voltage input terminal of the balanced attenuator stage, while the base electrode of the second transistor of the first emitter-coupled transistor pair is connected to the base electrode of the second transistor of the second emitter-coupled transistor pair as well as to the control voltage input terminal of the balanced attenuator stage.

9. The invention as defined in claim 6 wherein the bias shifting stage comprises an emitter-coupled transistor pair, the base electrode of one transistor of said emitter-coupled transistor pair being connected to the control voltage input terminal of said bias shifting stage, the base electrode of the other transistor of said emitter-coupled transistor pair being connected to the reference voltage input terminal of said bias shifting stage, the collector electrode of said other transistor being connected to the signal output terminal of said shifting stage and, via diode means, to the signal input terminal of said shifting stage.

10. The invention as defined in claim 6 wherein the peak detector circuit comprises a rectifying means in cascade with a low-pass filter, the input detector terminal of the peak detector circuit being connected to the rectifying means and output detector terminal of the peak detector circuit being connected to the low-pass filter, and wherein the bias shifting stage comprises an emitter-coupled transistor pair, the base electrode of one transistor of said emitter-coupled transistor pair being connected to the control voltage input terminal of said bias shifting stage, the base electrode of the other transistor of said emitter-coupled transistor pair being connected to the reference voltage input terminal of said bias shifting stage, the collector electrode of said other transistor being connected to the signal output terminal of said shifting stage and, via diode means, to the signal input terminal of said shifting stage.

11. The invention as defined in claim 10 wherein the balanced attenuator stage comprises a first emitter-coupled transistor pair and a second emitter-coupled transistor pair, the emitter electrodes of the first emitter-coupled transistor pair being connected to the first balanced input attenuator terminal and the emitter electrodes of the second emitter-coupled transistor pair being connected to the second balanced input attenuator terminal, the collector electrode of a first transistor of the first emitter-coupled transistor pair being connected to the first balanced output attenuator terminal and the collector electrode of a first transistor of the second emitter-coupled transistor pair being connected to the second balanced output attenuator terminal, the base electrode of the first transistor of the first emitter-coupled transistor pair being connected to the base electrode of the first transistor of the second emitter-coupled transistor pair as well as to the reference voltage input terminal of the balanced attenuator stage, while the base electrode of the second transistor of the first emitter-coupled transistor pair is connected to the base electrode of the second transistor of the second emitter-coupled transistor pair as well as to the control voltage input terminal of the balanced attenuator stage.

12. An audio frequency automatic gain control circuit for a telephone tone receiver circuit comprising:

a. a first differential amplifier stage having first and second input terminals for connection to an audio frequency signal source and first and second balanced output terminals;

b. a balanced attenuator stage having a reference voltage input terminal and a control voltage input terminal, said attenuator stage further having first and second balanced input attenuator terminals and first and second balanced output attenuator terminals, the attenuation introduced by said balanced attenuator stage being substantially an exponential function of the voltage difference between a control voltage appearing at the control voltage input terminal and a reference voltage appearing at the reference voltage input terminal, the first and second balanced attenuator input terminals being respectively connected to the first and second balanced output terminals of the first differential amplifier stage;

c. a second differential amplifier stage having first and second balanced input terminals, and a single ended output terminal, the first and second balanced input terminals being respectively connected to the first and second balanced output attenuator terminals of the balanced attenuator stage;

d. a bias shifting stage having a reference voltage input terminal and a control voltage input terminal as well as a signal input terminal and a signal output terminal, the signal input terminal being connected to the single ended output terminal of the second differential amplifier stage, said bias shifting stage, introducing a d.c. level shift to audio frequency signals appearing at the signal input terminal of the bias shifting stage, said level shift being substantially a linear function of the voltage difference between the reference voltage appearing at the reference voltage input terminal and the control voltage appearing at the control voltage input terminal of the bias shifting stage;

e. an inverting amplifier having an input terminal and an output terminal, the input terminal of said amplifier being connected via a first capacitance means to the signal output terminal of the bias shifting stage;

f. a peak detector circuit having an input detector terminal and an output detector terminal, the input detector terminal being connected to the output terminal of the inverting amplifier and the output detector terminal being connected to the control voltage input terminal of the balanced attenuator stage as well as to the control voltage input terminal of the bias shifting stage;

whereby in response to an amplitude change in the audio frequency voltage appearing at the input terminals of the first differential amplifier stage, the control voltage appearing at the output detector terminal of the peak detector circuit correspondingly changes, thereby changing the attenuation introduced by the balanced attenuator stage, while changing the d.c. voltage level appearing at the signal output terminal of the bias shifting stage, so as to maintain the peak-to-peak audio signal voltage appearing at the output terminal of the amplifier at a substantially constant value.

13. The invention as defined in claim 12 wherein the peak detector circuit comprises a rectifying means in cascade with a low-pass filter, the input detector terminal of the peak detector circuit being connected to the rectifying means and output detector terminal of the peak detector circuit being connected to the low-pass filter.

14. The invention as defined in claim 12 wherein the balanced attenuator stage comprises a first emitter-coupled transistor pair and a second emitter-coupled transistor pair, the emitter electrodes of the first emitter-coupled transistor pair being connected to the first balanced input attenuator terminal and the emitter electrodes of the second emitter-coupled transistor pair being connected to the second balanced input attenuator terminal, the collector electrode of a first transistor of the first emitter-coupled transistor pair being connected to the first balanced output attenuator terminal and the collector electrode of a first transistor of the second emitter-coupled transistor pair being connected to the second balanced output attenuator terminal, the base electrode of the first transistor of the first emitter-coupled transistor pair being connected to the base electrode of the first transistor of the second emitter-coupled transistor pair as well as to the reference voltage input terminal of the balanced attenuator stage, while the base electrode of the second transistor of the first emitter-coupled transistor pair is connected to the base electrode of the second transistor of the second emitter-coupled transistor pair as well as to the control voltage input terminal of the balanced attenuator stage.

15. The invention as defined in claim 12 wherein the bias shifting stage comprises an emitter-coupled transistor pair, the base electrode of one transistor of said emitter-coupled transistor pair being connected to the control voltage input terminal of said bias shifting stage, the base electrode of the other transistor of said emitter-coupled transistor pair being connected to the reference voltage input terminal of said bias shifting stage, the collector electrode of said other transistor being connected to the signal output terminal of said shifting stage and, via diode means, to the signal input terminal of said shifting stage.

16. The invention as defined in claim 12 wherein the peak detector circuit comprises a rectifying means in cascade with a low-pass filter, the input detector terminal of the peak detector circuit being connected to the rectifying means and output detector terminal of the peak detector circuit being connected to the low-pass filter, and wherein the bias shifting stage comprises an emitter-coupled transistor pair, the base electrode of one transistor of said emitter-coupled transistor pair being connected to the control voltage input terminal of said bias shifting stage, the base electrode of the other transistor of said emitter-coupled transistor pair being connected to the reference voltage input terminal of said bias shifting stage, the collector electrode of said other transistor being connected to the signal output terminal of said shifting stage and, via diode means, to the signal input terminal of said shifting stage.

17. The invention as defined in claim 16 wherein the balanced attenuator stage comprises a first emitter-coupled transistor pair and a second emitter-coupled transistor pair, the emitter electrodes of the first emitter-coupled transistor pair being connected to the first balanced input attenuator terminal and the emitter electrodes of the second emitter-coupled transistor pair being connected to the second balanced input attenuator terminal, the collector electrode of a first transistor of the first emitter-coupled transistor pair being connected to the first balanced output attenuator terminal and the collector electrode of a first transistor of the second emitter-coupled transistor pair being connected to the second balanced output attenuator terminal, the base electrode of the first transistor of the first emitter-coupled transistor pair being connected to the base electrode of the first transistor of the second emitter-coupled transistor pair as well as to the reference voltage input terminal of the balanced attenuator stage, while the base electrode of the second transistor of the first emitter-coupled transistor pair is connected to the base electrode of the second transistor of the second emitter-coupled transistor pair as well as to the control voltage input terminal of the balanced attenuator stage.

18. An audio frequency automatic gain control circuit for a telephone tone receiver circuit comprising:

a. a first differential amplifier stage having first and second input terminals for connection to an audio frequency signal source and first and second balanced output terminals;

b. a balanced attenuator stage having a reference voltage input terminal and a control voltage input terminal, said attenuator stage further having first and second balanced input attenuator terminals and first and second balanced output attenuator terminals, the attenuation introduced by said balanced attenuator stage being substantially an exponential function of the voltage difference between a control voltage appearing at the control voltage input terminal and a reference voltage appearing at the reference voltage input terminal, the first and second balanced attenuator input terminals being respectively connected to the first and second balanced output terminals of the first differential amplifier stage;

c. a second differential amplifier stage having first and second balanced input terminals, and a single ended output terminal, the first and second balanced input terminals being respectively connected to the first and second balanced output attenuator terminals of the balanced attenuator stage;

d. a bias shifting stage having a reference voltage input terminal and a control voltage input terminal as well as a signal input terminal and a signal output terminal, the signal input terminal being connected to the single ended output terminal of the second differential amplifier stage said bias shifting stage, introducing a d.c. level shift to audio frequency signals appearing at the signal input terminal of the bias shifting stage, said level shift being substantially a linear function of the voltage difference between the reference voltage appearing at the reference voltage input terminal and the control voltage appearing at the control voltage input terminal of the bias shifting stage;

e. a direct coupled single ended amplifier stage having an input terminal and an output terminal, said input terminal being direct coupled to the signal output terminal of the bias shifting stage;

f. an inverting amplifier having an input terminal and an output terminal, the input terminal of said amplifier being connected via a first capacitance means to the output terminal of the single ended amplifier stage;

g. a peak detector circuit having an input detector terminal and an output detector terminal, the input detector terminal being connected to the output terminal of the inverting amplifier and the output detector terminal being connected to the control voltage input terminal of the balanced attenuator stage as well as to the control voltage input terminal of the bias shifting stage;

whereby in response to an amplitude change in the audio frequency voltage appearing at the input terminals of the first differential amplifier stage, the control voltage appearing at the output detector terminal of the peak detector circuit correspondingly changes, thereby changing the attenuation introduced by the balanced attenuator stage, while changing the d.c. voltage level appearing at the output terminal of the single ended amplifier stage, so as to maintain the peak-to-peak audio signal voltage appearing at the output terminal of the inverting amplifier at a substantially constant value.

19. The invention as defined in claim 18 wherein the balanced attenuator stage comprises a first emitter-coupled transistor pair and a second emitter-coupled transistor pair, the emitter electrodes of the first emitter-coupled transistor pair being connected to the first balanced input attenuator terminal and the emitter electrodes of the second emitter-coupled transistor pair being connected to the second balanced input attenuator terminal, the collector electrode of a first transistor of the first emitter-coupled transistor pair being connected to the first balanced output attenuator terminal and the collector electrode of a first transistor of the second emitter-coupled transistor pair being connected to the second balanced output attenuator terminal, the base electrode of the first transistor of the first emitter-coupled transistor pair being connected to the base electrode of the first transistor of the second emitter-coupled transistor pair as well as to the reference voltage input terminal of the balanced attenuator stage, while the base electrode of the second transistor of the first emitter-coupled transistor pair is connected to the base electrode of the second transistor of the second emitter-coupled transistor pair as well as to the control voltage input terminal of the balanced attenuator stage.

20. The invention as defined in claim 18 wherein the peak detector circuit comprises a rectifying means in cascade with a low-pass filter, the input detector terminal of the peak detector circuit being connected to the rectifying means and output detector terminal of the peak detector circuit being connected to the low-pass filter, and wherein the bias shifting stage comprise an emitter-coupled transistor pair, the base electrode of one transistor of said emitter-coupled transistor pair being connected to the control voltage input terminal of said bias shifting stage, the base electrode of the other transistor of said emitter-coupled transistor pair being connected to the reference voltage input terminal of said bias shifting stage, the collector electrode of said other transistor being connected to the signal output terminal of said shifting stage and, via diode means, to the signal input terminal of said shifting stage.

21. The invention as defined in claim 20 wherein the balanced attenuator circuit comprises a first emitter-coupled transistor pair and a second emitter-coupled transistor pair, the emitter electrodes of the first emitter-coupled transistor pair being connected to the first balanced input attenuator terminal and the emitter electrodes of the second emitter-coupled transistor pair being connected to the second balanced input attenuator terminal, the collector electrode of a first transistor of the first emitter-coupled transistor pair being connected to the first balanced output attenuator terminal and the collector electrode of a first transistor of the second emitter-coupled transistor pair being connected to the second balanced output attenuator terminal, the base electrode of the first transistor of the first emitter-coupled transistor pair being connected to the base electrode of the first transistor of the second emitter-coupled transistor pair as well as to the reference voltage input terminal of the balanced attenuator stage, while the base electrode of the second transistor of the first emitter-coupled transistor pair is connected to the base electrode of the second transistor of the second emitter-coupled transistor pair as well as to the control voltage input terminal of the balanced attenuator stage.

22. The invention as defined in claim 20 wherein the first differential amplifier stage comprises an emitter-coupled transistor pair, the base electrode of one transistor of said transistor pair being connected to the first input terminal of the first differential amplifier stage and the base electrode of the other transistor of said transistor pair being connected to the second input terminal of the first differential amplifier stage, while the collector electrodes of the said one and said other transistors being respectively connected to the first and second balanced output terminals of the first differential amplifier stage.

23. The invention as defined in claim 22 wherein the second differential amplifier stage comprises an emitter-coupled transistor pair, the base electrode of one transistor of said transistor pair being connected to the first balanced input terminal of the second differential amplifier stage and the base electrode of the other transistor of said transistor pair being connected to the second balanced input terminal of the second differential amplifier stage while the collector electrode of said one transistor being connected to the single-ended output terminal of said second differential amplifier stage.

* * * * *